(12) United States Patent
Chin et al.

(10) Patent No.: US 6,947,456 B2
(45) Date of Patent: Sep. 20, 2005

(54) OPEN-LOOP LASER DRIVER HAVING AN INTEGRATED DIGITAL CONTROLLER

(75) Inventors: Jesse Chin, Hillsborough, CA (US); Miaobin Gao, San Jose, CA (US); Robert Elsheimer, San Jose, CA (US); Matthew Scott Abrams, Santa Clara, CA (US); Heng-ju Cheng, Mountain View, CA (US); Takashi Hidai, Palo Alto, CA (US); Myunghee Lee, San Jose, CA (US); Song Liu, San Jose, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/735,315

(22) Filed: Dec. 12, 2000

(65) Prior Publication Data

US 2002/0105982 A1 Aug. 8, 2002

(51) Int. Cl.[7] .............. H01S 3/00; H01S 3/30; H01S 3/13
(52) U.S. Cl. .......... 372/38.02; 372/8; 372/38.1; 372/38.01; 372/38.08; 372/29.01
(58) Field of Search ............ 372/8, 29.01, 29.011, 372/29.014, 29.02, 38.1, 38.02, 38.08, 38.01, 43, 29.015, 34, 38.07

(56) References Cited

U.S. PATENT DOCUMENTS

| | | | |
|---|---|---|---|
| 4,952,949 A | 8/1990 | Uebbing | 346/154 |
| 4,982,203 A | 1/1991 | Uebbing et al. | 346/107 R |
| 5,016,027 A | 5/1991 | Uebbing | 326/107 R |
| 5,018,154 A | 5/1991 | Ohashi | |
| 5,019,769 A | 5/1991 | Levinson | |
| 5,383,208 A | 1/1995 | Queniat et al. | |
| 5,623,355 A * | 4/1997 | Olsen | 398/162 |
| 5,638,390 A | 6/1997 | Gilliland et al. | 372/38 |
| 5,734,672 A | 3/1998 | McMinn et al. | |
| 5,844,928 A * | 12/1998 | Shastri et al. | 372/38.02 |
| 6,195,370 B1 | 2/2001 | Haneda et al. | |
| 6,272,164 B1 | 8/2001 | McMinn et al. | |
| 2002/0064193 A1 * | 5/2002 | Diaz et al. | 372/26 |
| 2002/0094000 A1 * | 7/2002 | Heilman et al. | 372/38.02 |

OTHER PUBLICATIONS

Data sheet entitled "S7011 1.0/1.25 Gbps VCSEL Driver", Revision 3, Jun. 7, 1999, by Applied Micro Circuits Corporation (AMCC) of San Diego, California.

* cited by examiner

*Primary Examiner*—Minsun Oh Harvey
*Assistant Examiner*—Armando Rodriguez

(57) ABSTRACT

A laser driver for generating drive waveforms that are suitable for driving a single VCSEL or an array of VCSELs. A digital controller is integrated into the laser driver and is utilized to initially program and selectively adjust during the operation of the driver one or more of the following VCSEL drive waveform parameters: (1) bias current, (2) modulation current, (3) negative peaking depth, and (4) negative peaking duration. The laser driver has an aging compensation mechanism for monitoring the age of the laser and for selectively adjusting the dc and ac parameters of the VCSEL drive waveform to compensate for the aging of the laser. The laser driver also has a temperature compensation mechanism for monitoring the temperature of the driver IC and selectively adjusting the dc and ac parameters of the VCSEL drive waveform to compensate for the changes in temperature.

20 Claims, 7 Drawing Sheets

OPEN-LOOP LASER DRIVER HAVING AN INTEGRATED DIGITAL CONTROLLER

FIELD OF THE INVENTION

The present invention relates generally to semiconductor lasers, and more particularly, to an open-loop laser driver having an integrated digital controller for providing drive waveforms to lasers.

BACKGROUND OF THE INVENTION

An optical transmitter module is an important component in networking systems. The purpose of an optical transmitter module is to convert data signals in electrical form into corresponding data signals in optical form. In this manner, the data can be communicated as light to another module (e.g., an optical receiver module) through a light-conducting medium, such as a fiber optic cable.

The optical transmitter module typically employs a laser to convert the electrical data signals into the light data signals. One commonly utilized semiconductor laser is the vertical cavity surface emitting laser (VCSEL). However, the VCSEL is configured to operate only with input signals (e.g., drive waveforms) that conform to particular predetermined electrical properties. The drive waveforms can have both dc operating parameters and ac operating parameters. For example, the dc operating parameters may include bias current to obtain either average or low state output power. The ac operating parameters may include modulation current, peaking current, and time constant parameters associated with pulsed waveforms. The data signals typically do not have these predetermined electrical characteristics (e.g., specific dc and ac operating parameters). Consequently, a circuit is needed for accepting the data signals, and responsive thereto, for generating corresponding VCSEL drive signals (e.g., a drive waveform) with the electrical characteristics that are suitable to drive the VCSEL. This circuit is commonly referred to as a VCSEL driver.

Furthermore, the VCSEL driver programs or sets the drive waveform with particular dc and ac parameters in order to optimize the bit error rate (BER) of the fiber optic link using the transmitter. The bit error rate is simply a measure of the number of bit errors caused by the transmitter module. A bit error is simply a data error when a data "1" is transmitted as a data "0" or when a data "0" is transmitted as a data "1".

There are two main approaches in the design of prior art laser drivers. The first approach employs a closed loop (i.e., uses optical feedback to adjust the light output power) to program the drive waveforms. The second approach employs an open loop (i.e., does not use optical feedback to adjust the light output power) to program the drive waveforms. These prior art approaches with their attendant disadvantages are described hereinafter.

Closed-Loop Approaches

U.S. Pat. No. 5,638,390 describes an exemplary closed-loop approach embodied in a laser output power stabilizing circuit. The laser output power stabilizing circuit uses a photodiode to monitor the laser's optical power. The photodiode output is compared to a reference voltage from a digital potentiometer, to obtain the correct dc bias current for the laser. At the time of the transmitter's manufacture, the digital potentiometer is set to optimize the laser's dc bias current. During operation of the transmitter, the laser's bias current is adjusted when any change in photodiode output occurs.

Unfortunately, these closed-loop approaches suffer from several disadvantages. First, the use of the photodiode increases the cost of the optical transmitter. Second, the requirement of the photodiode introduces packaging concerns related to the mounting of the photodiodes in such a manner as to be optimally aligned with the VCSEL. Third, the closed-loop approaches require complex feedback circuits that need to be replicated for each VCSEL, thereby further increasing costs and manufacturing complexity.

Open-Loop Approaches

The data sheet for the AMCC S7011 transmitter integrated circuit (IC) that is available from Applied Micro Circuits Corporation (AMCC) describes an exemplary open-loop approach. The S7011 IC appears to be capable of adjusting the laser drive waveform parameters Imod and Ibias, given input from an external source (e.g., a microprocessor), or input from external resistors and voltage references. Unfortunately, the prior art open-loop approaches, including the AMCC approach, fail to provide or provide very limited mechanisms to adjust the drive waveform based on changes in age and temperature of the laser. These prior art open-loop approaches also fail to allow programming of the transitional aspects of the VCSEL drive waveform (e.g. negative peaking).

VCSEL Arrays

Recently, there has been interest in moving from a single VCSEL to an array of VCSELs, which for example, can be a plurality of VCSELs that are arranged in a row. As can be appreciated, an array of VCSELs can be employed to transmit more data through multi-channel fiber optic cable than a single VCSEL can transmit through a fiber optic cable having a single channel. Unfortunately, one of the engineering challenges for implementing the array of VCSELS is that optical waveform uniformity across the VCSEL array needs to be maintained in order to optimize the BER of the fiber optic link.

Consequently, correct settings for the dc and ac parameters of the drive waveforms are particularly critical for fiber optic transmitters using an array of VCSELs. The parameters must be set to maintain optical waveform uniformity across the VCSEL array. The setting of these properties needs to occur at the beginning of operation and also at periodic intervals during the product's lifetime.

Semiconductor electrical to optical transmitters often require a scheme to program the optical de and ac operating characteristics of the light-emitting device. Preferably, the programming is performed at the beginning of product use, and periodically programmed throughout the lifetime of the transmitter. Unfortunately, the prior art approaches that do periodically program the waveforms during the lifetime of the transmitter are costly, complex to implement, and limited to dc parameters. Those prior art approaches that address some of the ac issues, such as modulation current, are limited to programming only at the beginning of product use. Consequently, if the product requires programming during the operating life of the driver, these prior art approaches are unable to perform this type of programming.

Age Dependence of Light Output

Ideally, the laser's performance in terms of light output remains constant throughout the operating life of the laser. If this were the case, the drive waveforms can be programmed once by the laser driver and would require no further changes or re-programming. Unfortunately, in reality, VCSEL light output tends to degrade over the operating life of the laser. Consequently, it would be desirable to have a mechanism in the VCSEL driver for periodically adjusting the VCSEL drive waveform parameters to compensate for the degradation. Regrettably, the prior art approaches that employ an open-loop approach, such as the AMCC approach, are limited to programming the waveform parameters at the beginning of the product life and do not have a mechanism for periodically adjusting the VCSEL drive waveform parameters to compensate for the degradation.

Temperature Dependence of Light Output

Moreover, in an ideal situation, the laser's light output would be independent of operating temperature. If this were the case, the drive waveform would not require adjustment as the operating temperature changes. Unfortunately, in reality, the laser's light output is dependent on operating temperature. Accordingly, it would be desirable to have a mechanism that adjusts the drive waveforms as the operating temperature changes. By so doing, optimum VCSEL optical waveform characteristics can be maintained. Regrettably, the prior art approaches do not offer any mechanism for periodically adjusting the VCSEL drive waveform parameters to compensate for changing operating temperatures.

Based on the foregoing, there remains a need for a digital control method and apparatus for semiconductor lasers that overcomes the disadvantages set forth previously.

SUMMARY OF THE INVENTION

According to one embodiment, the laser driver of the present invention includes an integrated digital controller for programming the dc and ac parameters of the drive waveform that drives a single VCSEL or an array of VCSELs for use in a fiber optic transmitter. The digital controller is integrated into the driver IC and is utilized to program one or more of the following VCSEL drive waveform parameters: (1) bias current, (2) modulation current, (3) negative peaking depth, and (4) negative peaking duration.

In one embodiment, the laser driver includes an aging compensation mechanism for monitoring the age of the laser and for selectively adjusting the dc and ac parameters of the VCSEL drive waveform to compensate for the aging of the laser. Preferably, a timer is employed to monitor the age of the laser.

In another embodiment, the laser driver includes a temperature compensation mechanism for monitoring the temperature of the driver IC and selectively adjusting the dc and ac parameters of the VCSEL drive waveform to compensate for the changes in temperature. Preferably, a temperature sensor is employed to monitor the temperature of the driver IC.

As described previously, the optimization of VCSEL optical waveform characteristics in a multi-channel fiber optic transmitter can pose a difficult challenge. The laser driver of the present invention separately programs each channel's VCSEL drive waveform parameters initially and during operation of the transmitter in order to maintain optimum optical waveforms for each channel. By updating of VCSEL drive parameters during transmitter operation, the laser driver of the present invention compensates for aging of the laser and temperature changes.

According to another embodiment of the present invention, a design methodology for the programming of the VCSEL drive waveform is provided.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION OF THE PREFERRED EMBODIMENT

An open-loop laser driver having an integrated digital controller and programming method are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The laser driver of the present invention integrates a digital controller, data storage/retrieval facilities, and the needed mechanisms to initially set and periodically adjust the parameters of the VCSEL drive waveform for each channel to effectively compensate for aging and operating temperature changes.

Multiple Channel Fiber Optic Transmitter Module 90

Figure 1:
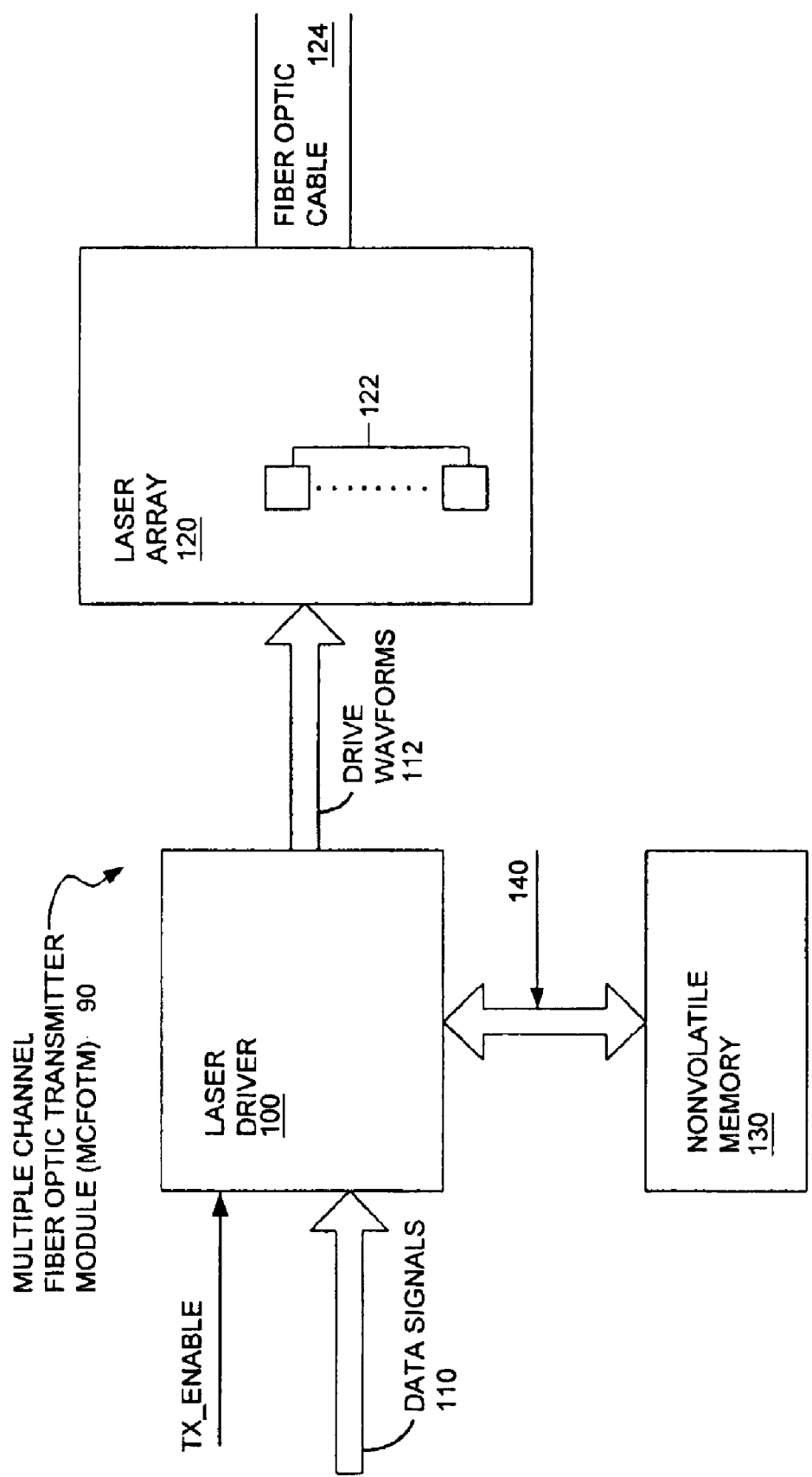
FIG. 1 is a block diagram of an exemplary multiple channel fiber optic transmitter module in which the laser driver of the present invention can be implemented.

FIG. 1 is a block diagram of an exemplary multiple channel fiber optic transmitter module (MCFOTM) 90 in which the laser driver of the present invention can be implemented. For example, the multiple channel fiber optic transmitter module (MCFOTM) 90 can be a 12-channel transmitter module. The multiple channel fiber optic transmitter module 90 includes a laser driver 100 for receiving data signals 110 and responsive thereto for generating drive waveforms 112, a laser array 120 that has a plurality of lasers 122 (e.g., VCSELs), and a nonvolatile memory 130 for storing drive waveform parameters. A fiber optic cable 124 is coupled to the laser array 120 in order to receive light launched therein by the lasers 122.

The drive current waveform associated with each channel's VCSEL diode is programmed by the laser driver 100 and the non-volatile memory 130. In one embodiment, the MCFOTM 90 includes a VCSEL driver, a 1×N VCSEL array, and an EEPROM. As described in greater detail hereinafter, the laser driver 100 includes a digital controller for programming and data retrieval.

In one embodiment, there are 2*N signal lines interposed between the laser driver 100 and the VCSEL array 120, where N signal lines are coupled to the anodes of the VCSELs, and N lines that are coupled to either a ground plane or to the cathodes of the VCSELs depending on the type of VCSEL and configuration of the laser driver 100. It is noted that N is the number of channels incorporated into the multiple channel fiber optic transmitter module 90.

An access point 140 is provided for reading and writing data into the memory 130 and the laser driver 100. As will be described in greater detail hereinafter, the access point 140 can be used to communicate test signals and data to the laser driver 100 and the memory 130.

Laser Driver 100

Figure 2:
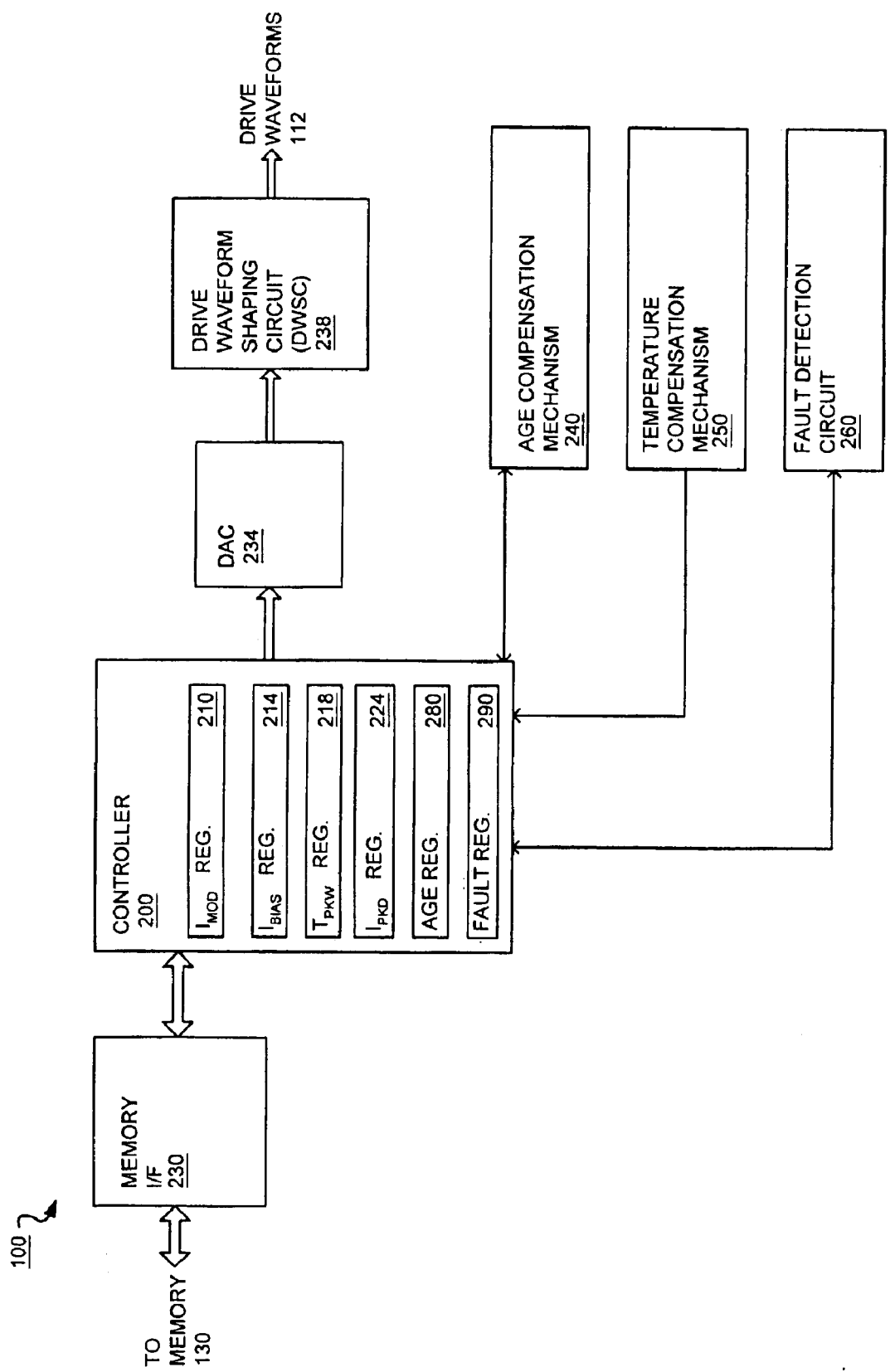
FIG. 2 illustrates in greater detail the laser driver of FIG. 1 according to one embodiment of the present invention.

FIG. 2 illustrates in greater detail the laser driver 100 of FIG. 1 according to one embodiment of the present invention. The laser driver 100 includes a controller 200, a plurality of drive parameter registers (210, 214, 218, 224) for storing drive parameters, an age compensation mechanism 240, a temperature compensation mechanism 250, a fault determination circuit 260, a plurality of digital-to-analog converters (DACs) 234, a drive waveform shaping circuit 238, an age register 280 for storing an age value, and a fault register 290 for storing a predetermined fault value.

Integrated Digital Controller 200 in the VCSEL Driver IC

One aspect of the present invention is the integration of a digital controller 200 in the laser driver 100. The laser driver 100 of the present invention employs the controller 200 to digitally program the dc and ac properties of the VCSEL drive waveform for a single laser die or for a 1×N array of laser die.

The laser driver 100 of the present invention provides a mechanism for individually programming the parameters (e.g., dc and ac parameters) for each laser die in an array in order to obtain uniformity in the optical waveforms across the array.

Programming the Driver Waveform Parameters

For example, the laser driver 100 can digitally program the VCSEL bias for an optical logic zero by using the integrated controller 200 and the digital-to-analog converters (DACs) 234. Furthermore, the laser driver 100 can digitally program the VCSEL drive waveform for modulating an optical zero to one transition by using the integrated controller 200 and the DACs 234.

One feature of the laser driver of the present invention is the programmability of the ac characteristics, such as negative peaking depth and duration, of the VCSEL drive waveform. Negative peaking refers to peaking of the VCSEL drive waveform during the logic one to logic zero falling transition. $I_{pkd}$ is the negative peaking depth. $T_{pkw}$ is the negative peaking duration.

The laser driver 100 can digitally program a negative peaking depth on the VCSEL drive waveform for use during an optical one to zero transition. The negative peaking is used to decrease the optical fall time during a one to zero transition. Also, the laser driver 100 can digitally program a negative peaking duration on the VCSEL drive waveform for use during an optical one to zero transition.

As described in greater detail hereinafter, the laser driver 100 of the present invention can also use the digital controller 200 to implement a timer function for periodically adjusting the VCSEL drive waveform to compensate for aging.

Furthermore, as described in greater detail hereinafter, the laser driver 100 of the present invention can use an integrated digital control loop to monitor die temperature and adjust the dc and ac parameters of the VCSEL drive waveforms to compensate for changes in temperature.

Age Compensation Mechanism 240

As described previously, the VCSEL light output tends to degrade over the operating life of the laser. In this regard, the VCSEL drive waveform parameters need to be adjusted periodically to compensate for the degradation. In one embodiment, the laser driver of the present invention includes a programmable timer that in cooperation with in the digital controller periodically adjusts each VCSEL's drive waveform parameters to compensate for aging.

A further aspect of the laser driver of the present invention is the integration of a timer function into the digital controller to enable the compensation of light output due to VCSEL aging. The timer allows periodic adjustment of the VCSEL drive waveform dc and ac parameters to compensate for aging.

In one embodiment, the age compensation mechanism 240 can be implemented by using an on-chip 10 Mhz clock, a programmable divisor (D) for the clock, a 31 bit counter (herein referred to as a low order aging counter) in the controller 200, and a 16 bit counter (herein referred to as a high order aging counter in the non-volatile memory 130. The clock divisor D combined with the 10 MHz clock period determine how often (in seconds or minutes) the high order aging counter is incremented. The controller 200 updates the DAC settings when the four MSB of the high order aging counter are incremented. For example, when D is equal to 32, and 10 Mhz clock period is equal to 100 ns, then the low order aging counter be incremented every 114.5 minutes, and the high order aging counter's 4 MSB is be incremented every 325 days.

If power to the transmitter is interrupted, the EEPROM stores the last counter setting in multiple registers (e.g., three registers). Once power resumes, the counter setting in each of the registers is compared with the counter values in the other two registers for accuracy. The counter setting found in at least two registers is chosen as the correct setting.

Temperature Compensation Mechanism 250

As described previously, as the operating temperature of the transmitter module changes, the VCSEL drive waveform parameters require adjustment in order to maintain optimum VCSEL optical waveform characteristics. In one embodiment, the laser driver of the present invention includes an integrated temperature monitor and feedback system for adjusting the VCSEL drive waveform parameters after a temperature change.

Another aspect of the laser driver of the present invention is the integration of a temperature sensing and feedback circuitry onto the driver IC.

The laser driver 100 also includes a non-volatile memory interface 230 for communicating with the nonvolatile memory 130. The nonvolatile memory 130 stores the DAC settings for $I_{mod}$, $I_{bias}$, $T_{pkw}$, and $I_{pkd}$ in a lookup table format. Each DAC setting can be referenced (e.g., accessed by a read operation) by employing an address that has the following format: AAAATTTTTCCCCXX. The "A"s represent the four most significant bits (MSB) of the aging counter. The "T"s represent five bits that represent the temperature of the laser driver 100. The "C"s represent the channel number, and the "X"s represent the DAC number. It is noted that the DACs for the $I_{mod}$, $I_{bias}$, $T_{pkw}$, $I_{pkd}$ parameters each has a different number associated therewith.

Figure 3:
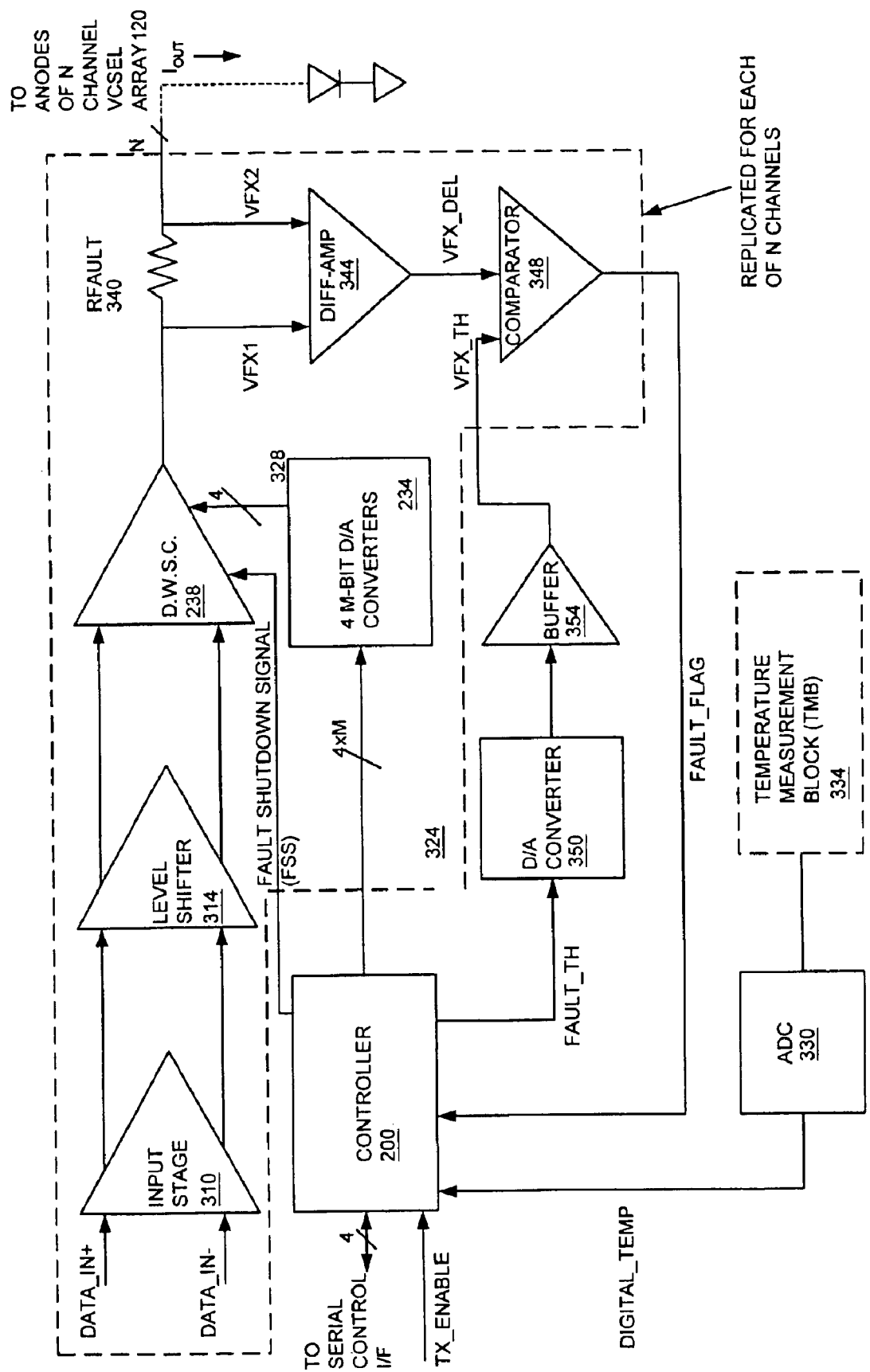
FIG. 3 is a block diagram illustrates in greater detail the laser driver of FIG. 1 according to one embodiment of the present invention.

FIG. 3 illustrates an exemplary implementation of the temperature compensation mechanism 250 and the fault determination circuit 260 of FIG. 2. For each channel, differential input data flows from Data_in+ and Data_in− through the input stage 310 and level shift stage 314 to the drive waveform shaping circuit 238. The drive waveform shaping circuit 238 generates a current pulse (i.e., a drive waveform) for each data pulse to drive a laser 122 in the laser array 120.

Figure 7:
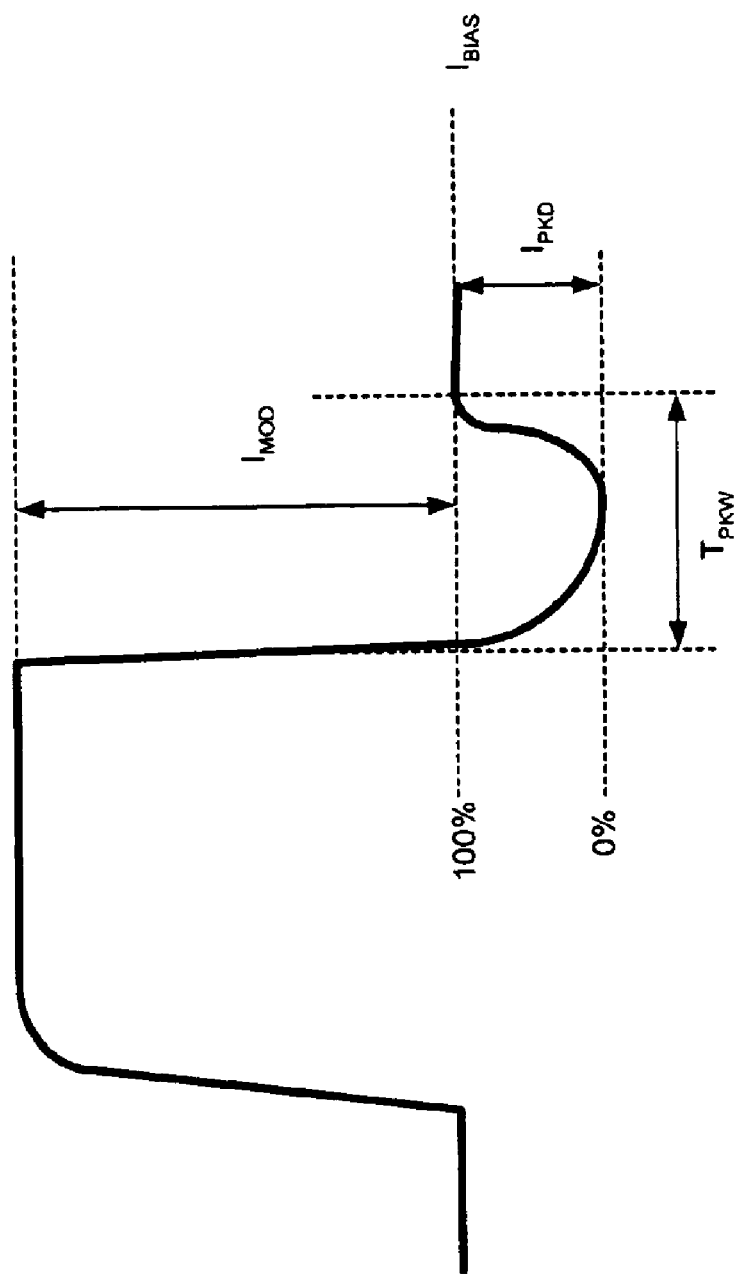
FIG. 7 illustrates an exemplary drive waveform that is generated by the laser driver of the present invention.

The VCSEL current pulse shape is optimized by the drive waveform shaping circuit 238 in terms of $I_{mod}$, $I_{bias}$, $T_{pkw}$, and $I_{pkd}$ as shown in FIG. 7. Each channel's output current $I_{out}$ is sent to one of the lasers 122 in the VCSEL array 120. An exemplary embodiment of the drive waveform shaping circuit 238 is described in greater detail hereinafter with reference to FIG. 4.

Temperature Measurement Block 334

As the VCSEL operating parameters need to change over time or temperature, the controller 200 updates the drive parameters in real time. For example, adjustments for temperature can occur periodically (e.g., in intervals of 30 milliseconds). In one embodiment, the temperature compensation mechanism 250 can be implemented in part by a temperature measurement block (TMB) 334 and an analog to digital converter 330. The temperature measurement block (TMB) 334 is a sensor that measures the die substrate temperature. The measured data is then converted to a digital format by the analog-to-digital converter (ADC) 330 and then provided to the controller 200 as the digital temp_ signal. The controller 200 then retrieves (from the EEPROM 130) new DAC settings for $I_{mod}$, $I_{bias}$, $T_{pkw}$, $I_{pkd}$ based upon the temperature. The new DAC settings are stored in registers (e.g., $I_{mod}$ register 210, $I_{bias}$ register 214, $T_{pkw}$ register 218, $I_{pkd}$ register 224). Preferably, the registers (herein referred to also as DAC registers) are disposed inside the DACs 234. The DACs 234 use the current DAC values in these registers (210, 214, 218, 224) to set the VCSEL drive waveform parameters.

Similarly, when an aging time point is reached as determined by the aging counter (e.g., the low order aging counter and the high order aging counter), the new DAC settings for $I_{mod}$, $I_{bias}$, $T_{pkw}$, and $I_{pkd}$ are retrieved from the EEPROM, and written to the DAC registers. The VCSEL drive waveform parameters are then adjusted.

Fault Detection Circuit 260

According to one embodiment, the fault detection circuit 260 includes a resistor (Rfault) 340, a differential amplifier 344, a comparator 348, a DAC 350, and a buffer 354. The fault detection circuit 260 determines when the average amount of current flowing through each VCSEL is above a predetermined safety limit. The amount of average VCSEL current is determined by measuring the voltage difference (vfx_del) across the Rfault resistor 340. The voltage difference across the Rfault resistor 340 is then compared to a predetermined fault threshold vfx_th. The fault threshold vfx_th is programmable by the user and may be stored in the EEPROM 130 and a fault register 290 in the controller 200 as fault_th.

If vfx_del is higher than vfx_th, the comparator 348 changes the state of the fault_flag. A change in state of the fault_flag signal for any channel interrupts the controller 200. The controller 200 then sets the DAC values for $I_{mod}$, $I_{bias}$, $T_{pkw}$, and $I_{pkd}$ for all N channels, to all zeroes, which in turn changes each channel's VCSEL current to zero milliamperes.

The state of the tx_enable line is toggled for the laser driver 100 to resume operation. Once operation is resumed, the controller 200 retrieves the correct DAC settings based upon temperature and the value in the aging counter. As described previously, the age value may be stored in multiple registers (e.g., age register 280) in the controller 200.

Data Waveform Shaping Circuit 238

Figure 4:
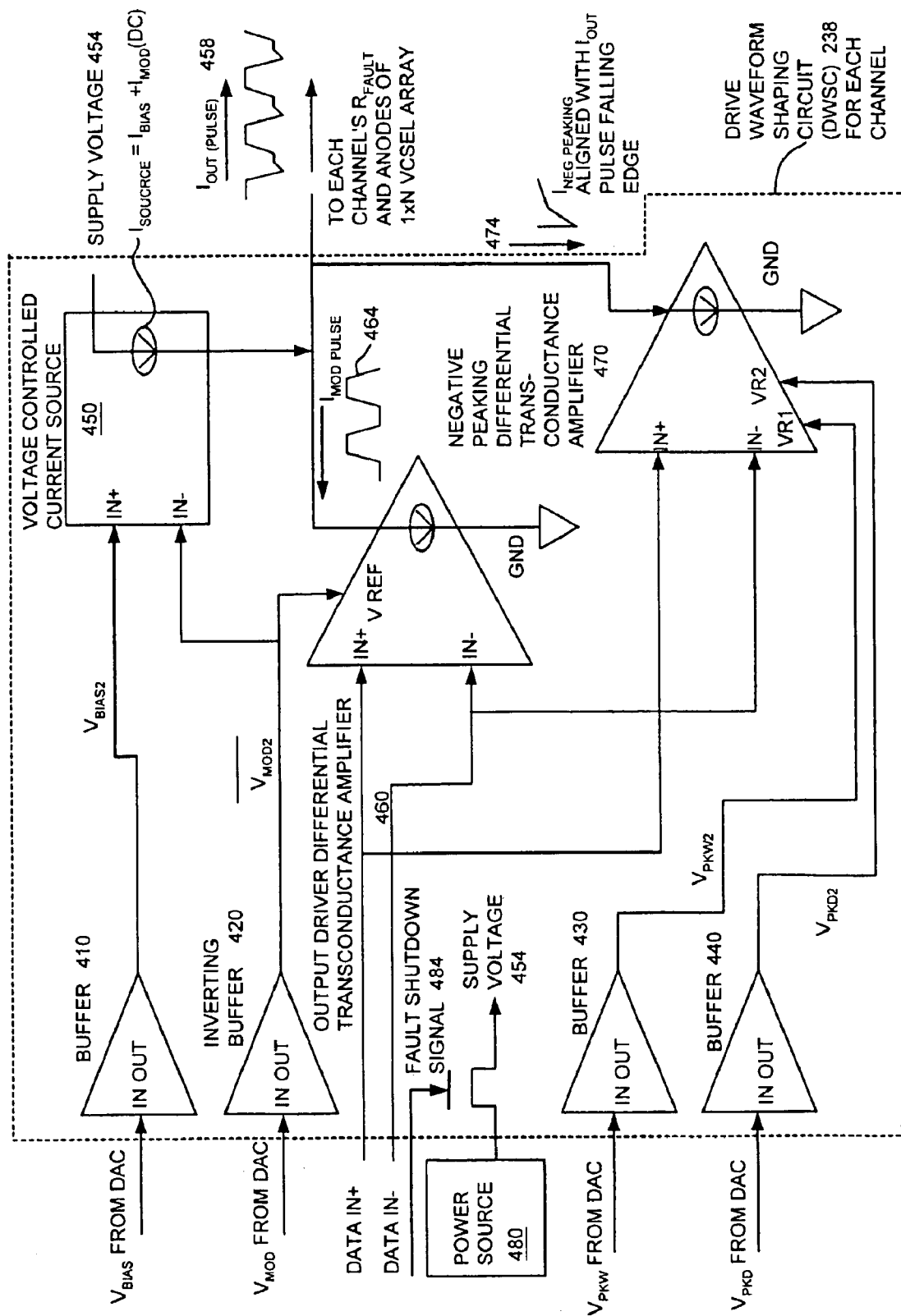
FIG. 4 illustrates in greater detail the drive waveform shaping circuit of FIG. 3 according to one embodiment of the present invention.

FIG. 4 illustrates in greater detail the drive waveform shaping circuit (DWSC) 238 of FIG. 3 according to one embodiment of the present invention. For the sake of brevity, the drive waveform shaping circuit 238 for a single channel is illustrated in FIG. 4 and described hereinafter. It is noted that the drive waveform shaping circuit 238 can be replicated to match the specific number of channels in a particular application.

In this embodiment, the drive waveform shaping circuit 238 includes inputs for receiving differential data signals (DataIn+and DataIn−) and inputs for receiving the output voltage signals from the DAC 234. Specifically, the drive waveform shaping circuit 238 further includes an input for receiving $V_{bias}$ from the DAC 234, an input for receiving $V_{mod}$ from the DAC 234, an input for receiving $V_{pkw}$ from the DAC 234, and an input for receiving $V_{pkd}$ from the DAC 234. As described previously, the output voltage signals of the DAC 234 are generated based on drive waveform dc and ac parameters associated with the current age and temperature conditions. Based on these inputs, the drive waveform shaping circuit 238 generates a drive waveform (e.g., the $I_{out}$) that is provided to an anode of a laser (e.g., an anode of the VCSEL 122). An example of this drive waveform that has a negative peaking portion is shown in FIG. 7.

The DWSC 238 includes a plurality of input buffers (410, 420, 430, and 440) for buffering the output voltage signals received from the DAC 234 before providing the voltage signals to the other blocks of the DWSC 238. It is noted that buffer 420 is an inverting buffer that receives $V_{mod}$ and generates an inverted $V_{mod}$ signal.

The DWSC 238 further includes a voltage controlled current source (VCCS) 450, an output driver differential transconductance amplifier (ODDTA) 460 that is coupled to the voltage controlled current source 450, and a negative peaking differential transconductance amplifier (NPDTA) 470 that is also coupled to the voltage controlled current source 450. The VCCS 450, ODDTA 460, and NPDTA 470 selectively shape the drive waveform ($I_{out}$) based on the input data signals and input voltage signals.

The voltage controlled current source (VCCS) 450 includes an input for receiving the $V_{bias2}$ signal, an input for receiving the inverted $V_{mod2}$ signal, and an input coupled to a supply voltage 454. Based on these inputs, the VCCS 450 generates $I_{source}$, which is a dc current sum of $I_{bias}$ and $I_{mod}$. The logic 1 level of the drive waveform ($I_{out}$) is equal to $I_{source}$. A data pulse into the ODDTA 460 causes $I_{modpulse}$ to be subtracted from $I_{source}$ to leave $I_{out} = I_{bias}$ for logic 0 data bits and $I_{out} = I_{bias} + I_{mod}$ for logic 1 data bits.

A power source 480 is coupled to the VCCS 450 through a switch 484 (e.g., a FET switch). The switch 484 selectively opens and closes in response to the fault shutdown signal. When the switch 484 is closed, the supply voltage signal 454 is provided to the VCCS 450.

The ODDTA 460 includes inputs for receiving the differential data signals (DataIn+and DataIn−) and an input for receiving the inverted $V_{mod2}$ signal. Based on these inputs, the ODDTA 460 produces a current pulse 464 (i.e., $I_{modpulse}$) for every input data pulse. The amplitude of $I_{modpulse}$ is set by a reference voltage provided to the $V_{ref}$ input. Since the reference voltage in this case is equal to the inverted $V_{mod2}$ signal, the amplitude of the current pulses is equal to the amplitude of the $I_{mod}$ signal.

The NPDTA 470 includes inputs for receiving the differential data signals (DataIn+and DataIn−), an input for receiving the $V_{pkw2}$ signal, and an input for receiving the $V_{pkd2}$ signal. Based on these inputs, the NPDTA 470 generates a negative peaking current transient 474 ($I_{negpeaking}$ or $I_{np}$) for every logic 1 to logic 0 transition observed on the DataIn pulses It is noted that the negative peaking current $I_{negpeaking}$ is aligned with the falling edge of the $I_{out}$ pulse. The negative peaking current transients ($I_{negpeaking}$) are also denoted herein as $I_{np}$. The negative peaking transient ($I_{negpeaking}$) has current amplitude (depth) and decay time (width) equal to $I_{pkd}$ and $T_{pkw}$, respectively. The NPDTA 470 employs the $V_{pkw2}$ signal to set the decay time for the negative peaking transient, and the $V_{pkd2}$ signal to set the current amplitude for the negative peaking transient.

In summary, the current sunk by ODDTA 460 is denoted as $I_{modpulse}$, and the current sunk by NPDTA 470 is denoted as $I_{negpeaking}$ or $I_{np}$. The following expression provides the value of the output current:

$$I_{out} = I_{source} - I_{modpulse} - I_{np}.$$

A data pulse causes $I_{modpulse}$ to subtract $I_{mod}$ from $I_{source}$ to leave $I_{out} = I_{bias}$ for logic 0 data bits, and leave $I_{out} = I_{bias} + I_{mod}$ for logic 1 data bits. A 1 to 0 transition causes an $I_{np}$ transient to be subtracted from $I_{source}$ in phase with the 1 to 0 transition.

Methodology

Figure 5:
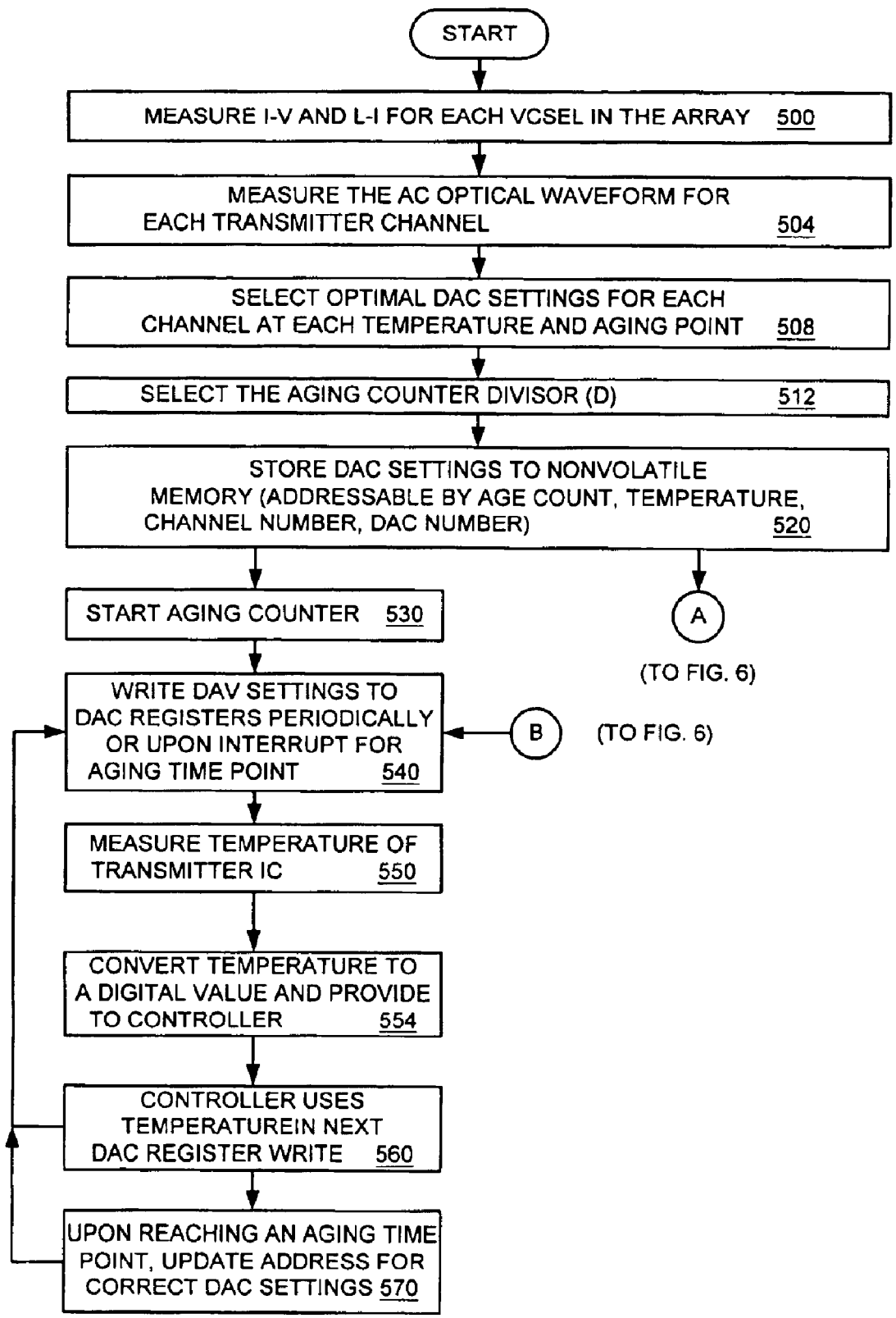
FIG. 5 is a flowchart illustrating the steps performed by the controller of FIG. 2. according to one embodiment of the present invention.

FIG. 5 is a flowchart illustrating the steps performed by the laser driver 100 of FIG. 1 to set and control the VCSEL drive parameters according to one embodiment of the present invention. Each VCSEL 122 in the VCSEL array 120 is characterized and the resulting data is saved. The lasers are then assembled into the MCFOTM 90. Each transmit channel in the assembled unit is characterized over temperature, and the resulting data is also saved. Then, the saved data is downloaded into the non-volatile memory 130. Each VCSEL is then independently programmed using the stored parameters. The programming is performed initially upon "power-up" (e.g., when the module is initially installed into a network device, such as a router or switch) and also periodically during operation as described hereinafter.

In step 500, the voltage versus current (V-I) and VCSEL light output versus current (L-I) are measured for each laser (e.g., VCSEL) 122 in the array 120. Preferably, these measurements are performed prior to assembly. Test equipment, such as Agilent 4145 Semiconductor Parameter Analyzer and Agilent 8153A Lightwave Multimeter, that are available from Agilent Technologies, Inc. can be employed to make the measurements.

TABLE I sets forth exemplary VCSEL V-I data and L-I data. This data is used by a production test system to determine the DAC settings to use during $I_{bias}$, $I_{mod}$, $I_{pkd}$, and $T_{pkw}$ optimization. The V-I data shows the maximum current range for a given VCSEL so as not to exceed a maximum VCSEL voltage allowed for correct circuit operation. Once the VCSEL current maximum is known, the L-I data is used to calculate the minimum VCSEL current for light output and the VCSEL slope efficiency (i.e., the change in light output with respect to a change in current). The allowable VCSEL current range and VCSEL slope efficiency, determined previously, are then used to calculate starting points for $I_{bias}$, $I_{mod}$, $I_{pkd}$, and $T_{pkw}$ during optimization.

TABLE I

| VCSEL Voltage (V) | VCSEL Current (mA) | VCSEL Light Output (mW) |
|---|---|---|
| 1.49 | 1.0 | 0.012 |
| 1.67 | 5.0 | 1.59 |

TABLE I-continued

| VCSEL Voltage (V) | VCSEL Current (mA) | VCSEL Light Output (mW) |
|---|---|---|
| 1.80 | 10.0 | 4.32 |
| 1.92 | 15.0 | 6.84 |

In step 504, the AC optical waveform for each transmitter channel is measured. Preferably, during production test, the AC optical waveform of each channel is measured and optimized for performance factors by a tester. These performance factors can include, but is not limited to, extinction ratio (i.e., the ratio of logic 1 optical power to logic 0 optical power), rise/fall times, overshoot, jitter, and mask margin. Optimization of the AC optical waveform utilizes the previously recorded VCSEL optical parameters.

AC optical waveform properties are measured for each VCSEL in the transmitter. The $I_{bias}$, $I_{mod}$, $I_{pkd}$, and $T_{pkw}$ DAC settings are varied around the starting points until the AC optical waveform properties are optimized. Preferably, the optimization is performed at a few temperatures. The AC optical waveform properties can include, but is not limited to, extinction ratio (ER), which is the optical power ratio of a logic 1 bit to a logic 0 bit, rise time, fall time, overshoot, and jitter.

The optimum DAC settings for $I_{bias}$, $I_{mod}$, $I_{pkd}$, and $T_{pkw}$ are then calculated for each allowed temperature and aging time point and written to the nonvolatile memory 130. The nonvolatile memory (e.g., an EEPROM) 130 stores all of the DAC settings for $I_{bias}$, $I_{mod}$, $I_{pkd}$, and $T_{pkw}$, referenced by temperature and aging time point. These addressable DAC settings are then used to program each VCSEL's current drive waveform during operation. For example, the $I_{bias}$ DAC register stores a number from 0 to $2^M$ (for an M bit DAC), which is used to generate a voltage $V_{bias}$ on the DAC output. $V_{bias}$ is used by the drive waveform shaping circuit 238 to set the $I_{bias}$ parameter of the VCSEL drive current waveform. Similarly, $V_{mod}$, $V_{pkw}$, and $V_{pkd}$ are generated by the other DACs.

In step 508, DAC settings for each channel are optimized at each temperature and aging point. The DACs 234 are used to convert the drive parameters into an analog signals that are utilized by the drive waveform shaping circuit (DWSC) 238 to generate the drive waveforms.

In one embodiment, the DACs 234 are integrated into the laser driver 100 and are M bits wide. The number of bits M is chosen to provide adequate resolution for each of the parameters. For example, M may be chosen to be 6 bits for typical implementations.

In step 512, an aging counter divisor (D) is selected. In step 520, the DAC settings (i.e., drive parameters) are downloaded into the non-volatile memory from a test system, for example. The DAC settings are stored in such a manner as to allow the retrieval of the DAC settings by aging count, temperature, channel number, and DAC number (i.e., the DAC settings in the non-volatile memory are addressable by aging count, temperature, channel number, and DAC number).

In step 530, the aging counter is started. In step 540, drive parameters are loaded into the drive registers (210, 214, 218, and 224) from the non-volatile memory 130 upon a predetermined condition. The predetermined condition can be, but is not limited to, the passage of time (e.g., every 30 milliseconds) or an interrupt for an aging time point. It is noted that step 540 occurs during the operation of the transmitter module 90.

In step 550, the temperature of the laser driver integrated circuit is measured by the temperature measurement block (TMB) 334. In step 554, the measured temperature is converted into a digital form (e.g., a digital_temp signal) and provided to the controller 200. In step 560, the controller 200 employs the measured temperature as one of the input parameters in a subsequent DAC register write cycle for updating the drive parameter registers (210, 214, 218, and 224).

In step 570, the controller 200 updates a read address for retrieving values for the drive parameters. Processing then proceeds to step 540 where the drive parameter registers are written with values read from the non-volatile memory 130 at the address that may be modified in step 570.

Handling Unsafe Current Conditions

Figure 6:
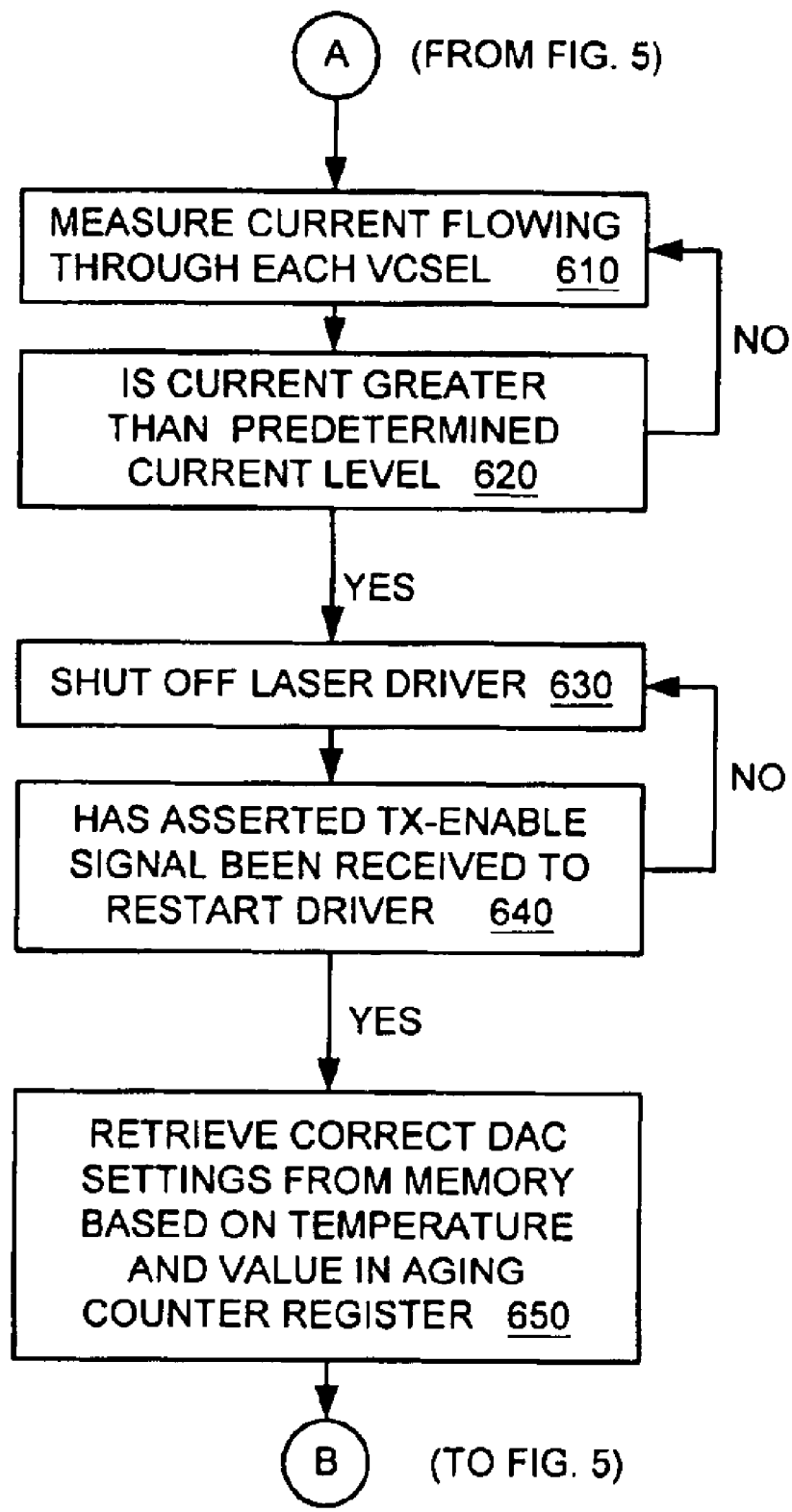
FIG. 6 is a flowchart illustrating the steps performed by the controller of FIG. 2. according to one embodiment of the present invention.

FIG. 6 is a flowchart illustrating the steps performed by the laser driver 100 of FIG. 1 to detect and manage unsafe current conditions according to one embodiment of the present invention. After step 520 of FIG. 5, the steps, described below for detecting and managing unsafe current conditions are performed. In step 610, the current flowing through each VCSEL is measured. In decision block 620, a determination is made whether the measured current is greater than a predetermined safe current. When the measured current is greater than a predetermined safe current, the output current of the laser driver 100 is maintained at a constant minimum current equal to a minimum $I_{bias}$ plus a minimum $I_{mod}$. Otherwise, when the measured current is not greater than a predetermined safe current, processing loops back to step 610.

In decision block 640, a determination is made whether a valid restart signal (e.g., a tx_enable signal) has been received by the laser driver 100. When a valid restart signal (e.g., a tx_enable signal) has been received by the laser driver 100, the processing proceeds to step 650. In step 650, the TMB 334 and the age register 280 are employed to generate an address based on a temperature value and age value. As noted previously, the nonvolatile memory 130 is addressable by aging count, temperature, channel number, and DAC number. Processing then proceeds to step 540 of FIG. 5, where the drive parameter registers are loaded with the values read from the non-volatile memory 130.

Otherwise, when a valid restart signal (e.g., a Tx_enable signal) has not been received by the laser driver 100, the processing proceeds to step 630 where the laser driver 100 remains in the minimum output current state.

The digital control method and apparatus for driving semiconductor lasers of the present invention has been described in connection with a VCSEL array. However, it is noted that the digital control method and apparatus for driving semiconductor lasers is useful for other applications whenever drive current is needed for driving any type of semi-conductor laser. The digital control method and apparatus for semiconductor lasers of the present invention are especially useful for applications that have temperature fluctuations across array elements, and yet require an even performance across elements in the array. The digital control method and apparatus for semiconductor lasers of the present invention are also useful for applications whose light output tends to degrade over its operating life. The digital control method and apparatus for semiconductor lasers of the present invention are especially useful for applications that can benefit from programming of AC parameters.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. An optical transmitter comprising:

an array having at least one semiconductor laser;

a memory for storing a plurality of drive waveform parameters;

a driver circuit, coupled to the memory and the array, for receiving data signals and at least one drive waveform parameter, and responsive thereto, for generating at least one drive waveform to drive the semiconductor laser; wherein the drive waveform includes a negative peak portion;

wherein the drive waveform parameters includes at least one parameter for affecting the negative peak portion of the drive waveform.

2. The optical transmitter of claim 1 wherein the array includes a plurality of semiconductor lasers, each of the plurality of semiconductors lasers associated with its own set of drive waveform parameters;

wherein the driver circuit generates an individual drive waveform for each semiconductor laser based on the set of drive waveform parameters associated with that semiconductor laser increasing the uniformity in the resulting optical waveforms of the semiconductor lasers; and wherein the driver circuit updates at least one drive waveform parameter during the operation of the transmitter based on one of an aging factor of the array and a temperature factor of the array and generates an updated drive waveform based on the updated drive waveform parameter.

3. The optical transmitter of claim 1 wherein the memory stores the dc properties and the ac properties for each semiconductor laser in the array for different age factors and temperature factors; and wherein the driver circuit generates a drive waveform for each semiconductor laser based on the dc properties and ac properties for that semiconductor laser.

4. The optical transmitter of claim 1 wherein the driver circuit includes an integrated digital controller and a temperature sensor for sensing the temperature of the driver circuit; and wherein the integrated digital controller selectively updates the drive waveform parameters based on the temperature of the driver circuit.

5. The optical transmitter of claim 1 wherein the driver circuit includes and integrated digital controller having a timer function for periodically adjusting at least one drive waveform parameter to compensate for aging of the semiconductor laser.

6. The optical transmitter of claim 1 wherein the array includes a 1×N array semiconductor lasers.

7. The optical transmitter of claim 6 wherein the semiconductor laser is a vertical cavity emitting laser (VCSEL).

8. A laser driver for generating drive waveforms that drives an array having at least one semiconductor laser comprising:

a storage for storing a plurality of drive waveform parameters;

a digital controller coupled to the storage for initially accessing a first set of drive waveform parameters that correspond to a first semiconductor laser and subsequently accessing the storage for other sets of drive waveform parameters corresponding to the first semiconductor laser based on one of an age factor and a temperature factor; and a waveform shaping circuit coupled to the digital controller for receiving the set of drive waveform parameters and responsive thereto for generating a drive waveform that is dependent on the set of drive waveform parameters; wherein the waveform includes a negative peaking portion; and wherein the drive waveform parameters includes at least one parameter for affecting the negative peaking portion of the drive waveform.

9. The laser driver of claim 8 further comprising:
an aging compensation mechanism for monitoring the age of the laser and for providing an age factor for use in selecting a set of drive waveform parameters from the storage to be utilized in generating a drive waveform that compensates for the aging of the laser.

10. The laser driver of claim 8 further comprising:
a temperature compensation mechanism for monitoring the temperature of the driver and for providing a temperature factor for use in selecting a set of drive waveform parameters from the storage to be utilized in generating a drive waveform that compensates for the changes in temperature of the laser.

11. The laser driver of claim 8 wherein the drive waveform parameters includes
at least one dc parameter and at least one ac parameter.

12. The laser driver of claim 8 wherein the drive waveform parameters associated with the drive waveform include one of
bias current, modulation current, negative peaking depth, and negative peaking duration.

13. The laser driver of claim 8 further comprising:
a digital to analog converter for receiving the drive waveform parameters in digital form and responsive thereto for generating corresponding drive waveform parameters in analog form; and
wherein the drive waveform parameters in analog form are provided to the waveform shaping circuit.

14. The laser driver of claim 8 wherein the laser driver is suitable for driving a single vertical cavity surface emitting laser (VCSEL) or an array of vertical cavity surface emitting lasers (VCSELs).

15. A method for providing a drive waveform that includes ac characteristics for at least one semiconductor laser in a laser driver, the laser driver including an integrated digital controller and a storage for storing a plurality of drive waveform parameters, the method comprising the steps of:
employing the digital controller to access from the storage a first set of drive waveform parameters for a first laser; and
generating a drive waveform for driving the first laser based on the first set of waveform parameters;
employing the digital controller to access from the storage a second set of drive waveform parameters during the operation of the laser driver based on one of a temperature factor and an aging factor; and
generating an updated drive waveform for driving the first laser based on the second set of drive waveform parameters;
wherein the waveform includes a negative peaking portion; and
wherein the drive waveform parameters includes at least one parameter for affecting the negative peaking portion of the drive waveform.

16. The method of claim 15 wherein the drive waveform parameters in the storage are organized by laser, temperature factor, and age factor; and wherein adjusting the parameter during the operation of the laser driver includes retrieving at least one updated drive waveform parameter from the storage based on the operating temperature of the semiconductor laser.

17. The method of claim 15 wherein the drive waveform parameters in the storage are organized by laser, temperature factor, and age factor; and wherein adjusting the parameter during the operation of the laser driver includes periodically retrieving at least one updated drive waveform parameter from the storage based on the age of the semiconductor laser.

18. The method of claim 15 wherein employing the digital controller to access from the storage a first set drive waveform parameters for a first laser includes one of:
prior to operation of the first laser,
digital programming of a bias current parameter;
digital programming of a modulation current parameter;
digital programming of a negative peaking depth parameter during an optical one to optical zero transition; and
digital programming of a negative peaking duration parameter during an optical one to optical zero transition.

19. The method of claim 15 wherein employing the digital controller to access from the storage a second set of drive waveform parameters during the operation of the laser driver based on one of a temperature factor and an aging factor includes one of:
digital programming of an updated bias current parameter;
digital programming of an updated modulation current parameter;
digital programming of an updated negative peaking depth parameter during an optical one to optical zero transition; and
digital programming of an updated negative peaking duration parameter during an optical one to optical zero transition.

20. The optical transmitter of claim 1 wherein the drive waveform parameters include a bias current parameter, a modulation current paramerer, a negative peaking depth paramerer, and a negative peaking duration parameter for each semiconductor laser in the array.

* * * * *

US006947456C1

(12) EX PARTE REEXAMINATION CERTIFICATE (8966th)
United States Patent
Chin et al.

(10) Number: US 6,947,456 C1
(45) Certificate Issued: Apr. 17, 2012

(54) OPEN-LOOP LASER DRIVER HAVING AN INTEGRATED DIGITAL CONTROLLER

(75) Inventors: Jesse Chin, Hillsborough, CA (US); Miaobin Gao, San Jose, CA (US); Robert Elsheimer, San Jose, CA (US); Matthew Scott Abrams, Santa Clara, CA (US); Heng-Ju Cheng, Mountain View, CA (US); Takashi Hidai, Palo Alto, CA (US); Myunghee Lee, San Jose, CA (US); Song Liu, San Jose, CA (US)

(73) Assignee: Avago Technologies Fiber IP (Singapore) Pte Ltd., Sinagpore (SG)

Reexamination Request:
No. 90/011,519, Mar. 1, 2011

Reexamination Certificate for:
Patent No.: 6,947,456
Issued: Sep. 20, 2005
Appl. No.: 09/735,315
Filed: Dec. 12, 2000

(51) Int. Cl.
*H01S 3/00* (2006.01)

(52) U.S. Cl. ......................... 372/38.02; 372/8

(58) Field of Classification Search ................. 372/38
See application file for complete search history.

(56) References Cited

To view the complete listing of prior art documents cited during the proceeding for Reexamination Control Number 90/011,519, please refer to the USPTO's public Patent Application Information Retrieval (PAIR) system under the Display References tab.

*Primary Examiner* — John S. Heyman

(57) ABSTRACT

A laser driver for generating drive waveforms that are suitable for driving a single VCSEL or an array of VCSELs. A digital controller is integrated into the laser driver and is utilized to initially program and selectively adjust during the operation of the driver one or more of the following VCSEL drive waveform parameters: (1) bias current, (2) modulation current, (3) negative peaking depth, and (4) negative peaking duration. The laser driver has an aging compensation mechanism for monitoring the age of the laser and for selectively adjusting the dc and ac parameters of the VCSEL drive waveform to compensate for the aging of the laser. The laser driver also has a temperature compensation mechanism for monitoring the temperature of the driver IC and selectively adjusting the dc and ac parameters of the VCSEL drive waveform to compensate for the changes in temperature.

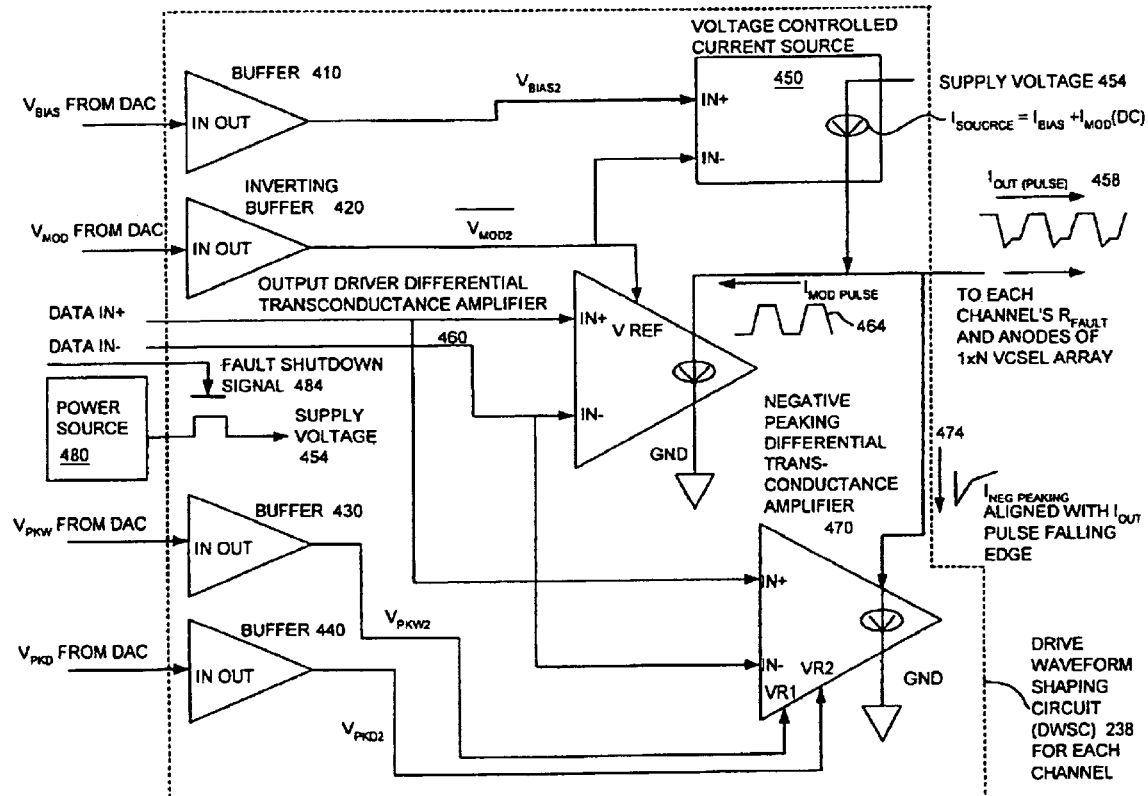

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 5, 6, 8, 11, 15, 18 and 20 are determined to be patentable as amended.

Claims 2-4, 7, 9-10, 12-14, 16-17 and 19, dependent on an amended claim, are determined to be patentable.

New claims 21, 22, 23 and 24 are added and determined to be patentable.

1. An optical transmitter comprising:
an array having at least one semiconductor laser;
a memory for storing a plurality of drive waveform parameters;
a driver circuit, coupled to the memory and the array, for receiving data signals and at least one drive waveform parameter, and responsive thereto, for generating at least one drive waveform to drive the semiconductor laser;
wherein the drive waveform includes a negative peak portion;
wherein the drive waveform parameters [includes] *include* at least one parameter for affecting the negative peak portion of the drive waveform.

5. The optical transmitter of claim 1 wherein the driver circuit includes [and] *an* integrated digital controller having a timer function for periodically adjusting at least one drive waveform parameter to compensate for aging of the semiconductor laser.

6. The optical transmitter of claim 1 wherein the array includes a 1×N array *of* semiconductor lasers.

8. A laser driver for generating drive waveforms that drives an array having at least one semiconductor laser comprising:
a storage for storing a plurality of drive waveform parameters;
a digital controller coupled to the storage for initially accessing a first set of drive waveform parameters that correspond to a first semiconductor laser and subsequently accessing the storage for other sets of drive waveform parameters corresponding to the first semiconductor laser based on one of an age factor and a temperature factor; and
a waveform shaping circuit coupled to the digital controller for receiving the set of drive waveform parameters and responsive thereto for generating a drive waveform that is dependent on the set drive waveform parameters;
wherein the waveform includes a negative peaking portion; and
wherein the drive waveform parameters [includes] *include* at least one parameter for affecting the negative peaking portion of the drive waveform.

11. The laser driver of claim 8 wherein the drive waveform parameters [includes] *include* at least one dc parameter and at least one ac parameter.

15. A method for providing drive waveform that includes ac characteristics for at least one semiconductor laser in a laser driver, the driver including an integrated digital controller and a storage for storing a plurality of drive waveform parameters, the method comprising the steps of:
employing the digital controller to access from the storage a first set of drive waveform parameters for a first laser; [and]
generating a drive waveform for driving the first laser based on the first set of waveform parameters;
employing the digital controller to access from the storage a second set of drive waveform parameters during the operation of the laser driver based on one of a temperature factor and an aging factor; and
generating an updated drive waveform for driving the first laser based on the second set of drive waveform parameters;
wherein the waveform includes a negative peaking portion; and
wherein the drive waveform parameters [includes] *include* at least one parameter for affecting the negative peaking portion of the drive waveform.

18. The method of claim 16 wherein employing the digital controller to access from the storage a first set *of* drive waveform parameters for the first laser includes one of:
prior to operation of the first laser, digital programming of a bias current parameter;
digital programming of a modulation current parameter;
digital programming of a negative peaking depth parameter during an optical one to optical zero transition; and
digital programming of a negative peaking duration parameter during an optical one to optical zero transition.

20. The optical transmitter of claim 1 wherein the drive waveform parameters include a bias current parameter, a modulation current [paramerer] *parameter*, a negative peaking depth [paramerer] *parameter*, and a negative peaking duration parameter for each semiconductor laser in the array.

*21. An optical transmitter comprising:*
*an array having at least one semiconductor laser;*
*a memory for storing a plurality of drive waveform parameters;*
*a driver circuit, coupled to the memory and the array, for receiving a data signal and at least one drive waveform parameter, and responsive thereto, for generating at least one drive waveform to drive the semiconductor laser;*
*wherein the drive waveform includes a negative peak portion generated by applying a negative peaking current transient to the data signal during a falling edge of a transition from logic one to logic zero in the data signal, such that the negative peak portion has a duration that is shorter than the duration of its associated data bit;*
*wherein the drive waveform parameters include at least one parameter for affecting the negative peak portion of the drive waveform.*

*22. The optical transmitter of claim 21 wherein the driver circuit generates the negative peaking current transient.*

*23. The optical transmitter of claim 22 wherein the driver circuit generates the negative peaking current transient* based on the at least one parameter affecting the negative peaking portion of the drive waveform.

24. The optical transmitter of claim 23 wherein the at least one parameter affecting the negative peaking portion of the drive waveform includes a negative peaking duration parameter and a negative peaking depth parameter.

\* \* \* \* \*